(12) United States Patent
Newell

(10) Patent No.: US 7,119,708 B2
(45) Date of Patent: Oct. 10, 2006

(54) APPARATUS AND METHOD FOR PROVIDING VISUAL AND HARDWARE ADDRESSING INFORMATION

(75) Inventor: Larry Dale Newell, Golden, CO (US)

(73) Assignee: Avaya Technology Corp, Basking Ridge, NJ (US)

( * ) Notice: Subject to any disclaimer, the term of this patent is extended or adjusted under 35 U.S.C. 154(b) by 406 days.

(21) Appl. No.: 10/411,823

(22) Filed: Apr. 11, 2003

(65) Prior Publication Data
US 2004/0201490 A1 Oct. 14, 2004

(51) Int. Cl.
*H02J 13/00* (2006.01)
*G05B 23/02* (2006.01)
*G06F 17/00* (2006.01)

(52) U.S. Cl. .............. 340/825.52; 340/3.5; 340/3.54; 700/236

(58) Field of Classification Search ........... 340/825.52, 340/825.04, 3.5, 825.21, 3.7; 700/236; 361/798, 361/740; 439/152, 157
See application file for complete search history.

(56) References Cited

U.S. PATENT DOCUMENTS

| | | | | |
|---|---|---|---|---|
| 3,854,125 A | * | 12/1974 | Ehling et al. | 714/27 |
| 4,870,704 A | * | 9/1989 | Matelan et al. | 710/120 |
| 5,034,731 A | * | 7/1991 | Rundsztuk et al. | 340/691.1 |
| 5,129,974 A | * | 7/1992 | Aurenius | 156/64 |
| 5,428,507 A | * | 6/1995 | Chatel et al. | 361/798 |
| 5,630,270 A | * | 5/1997 | O'Malley | 29/832 |
| 5,896,513 A | * | 4/1999 | Fisch et al. | 710/107 |
| 6,002,638 A | * | 12/1999 | John | 365/233 |
| 6,582,241 B1 | * | 6/2003 | Lutz, Jr. | 439/157 |

\* cited by examiner

*Primary Examiner*—Brian Zimmerman
*Assistant Examiner*—Nam Nguyen
(74) *Attorney, Agent, or Firm*—John C. Moran

(57) ABSTRACT

An apparatus and method combine visual addresses and electronic addresses for identification of electronic units. In which, the apparatus is one device per electronic unit. Each device comprises a circuit board encapsulated in a device enclosure, and the circuit board provides electronic identification for the electronic unit. The electronic identification of the electronic unit is communicated via bus pins attached to the circuit board to the electronic unit upon the bus pins being inserted into the electronic unit. A cabinet label is affixed to the device enclosure provides visual identification for the electronic unit.

10 Claims, 5 Drawing Sheets

| Slot Number | HEX Address for indicated Carrier Position | | | | |
|---|---|---|---|---|---|
| | A | B | C | D | E |
| 1 | 1B | 42 | 62 | 22 | 2 |
| 2 | 1C | 43 | 63 | 23 | 3 |
| 3 | 1D | 44 | 64 | 24 | 4 |
| 4 | 1E | 45 | 65 | 25 | 5 |
| 5 | 1F | 46 | 66 | 26 | 6 |
| 6 | 38 | 47 | 67 | 27 | 7 |
| 7 | 39 | 48 | 68 | 28 | 8 |
| 8 | 3A | 49 | 69 | 29 | 9 |
| 9 | 3B | 4A | 6A | 2A | 0A |
| 10 | 3C | 4B | 6B | 2B | 0B |
| 11 | 3D | 4C | 6C | 2C | 0C |
| 12 | 3E | 4D | 6D | 2D | 0D |
| 13 | 3F | 4E | 6E | 2E | 0E |
| 14 | 58 | 4F | 6F | 2F | 0F |

FIG. 4

| Slot Number | Bus Address Lead Connections (Switch Connections) | | | | | | |
|---|---|---|---|---|---|---|---|
| | BA6 | BA5 | BA4 | BA3 | BA2 | BA1 | BA0 |
| 1 | SW5 | SW4 | SW2 | SW2 | GND | OPEN | SW2 |
| 2 | SW5 | SW4 | SW2 | SW2 | SW2 | SW1 | SW1 |
| 3 | SW5 | SW4 | SW2 | SW2 | OPEN | GND | SW2 |
| 4 | SW5 | SW4 | SW2 | SW2 | OPEN | SW2 | SW1 |
| 5 | SW5 | SW4 | SW2 | SW2 | OPEN | OPEN | SW2 |
| 6 | SW5 | SW3 | SW2 | SW2 | SW1 | SW1 | SW1 |
| 7 | SW5 | SW3 | SW2 | OPEN | GND | GND | SW2 |
| 8 | SW5 | SW3 | SW2 | OPEN | GND | SW2 | SW1 |
| 9 | SW5 | SW3 | SW2 | OPEN | GND | OPEN | SW2 |
| 10 | SW5 | SW3 | SW2 | OPEN | SW2 | SW1 | SW1 |
| 11 | SW5 | SW3 | SW2 | OPEN | OPEN | GND | SW2 |
| 12 | SW5 | SW3 | SW2 | OPEN | OPEN | SW2 | SW1 |
| 13 | SW5 | SW3 | SW2 | OPEN | OPEN | OPEN | SW2 |
| 14 | SW6 | SW4 | SW2 | OPEN | SW1 | SW1 | SW1 |

FIG. 5

| Backplane Net Name | Carrier Selection Connections | | | | |
|---|---|---|---|---|---|
| | A | B | C | D | E |
| SW1 | CONNECT | OPEN | OPEN | OPEN | OPEN |
| SW2 | OPEN | CONNECT | CONNECT | CONNECT | CONNECT |
| SW3 | OPEN | CONNECT | OPEN | OPEN | CONNECT |
| SW4 | CONNECT | CONNECT | OPEN | OPEN | CONNECT |
| SW5 | CONNECT | OPEN | OPEN | CONNECT | CONNECT |
| SW6 | OPEN | OPEN | OPEN | CONNECT | CONNECT |

FIG. 6

APPARATUS AND METHOD FOR PROVIDING VISUAL AND HARDWARE ADDRESSING INFORMATION

TECHNICAL FIELD

This invention relates to computer systems and methods in general, and in particular, to the identification of hardware modules.

BACKGROUND OF THE INVENTION

Within the prior art, software systems are often touted as being flexible and easily adaptable. In general, this is only true for small software programs and controlling non-real time events. For large software systems controlling real time processes, such as telephone switching processes, these systems are not particularly flexible. The reason for this inflexibility is that the systems are quite large, each portion of the system is time critical, and reliability is of the utmost importance. It is commonplace for software that runs on a personal computer to use a message when it is necessary for the user to reboot the system or for the system to automatically reboot itself. However, in real time systems, such as telecommunication systems, the software must run unattended and maintain reliability through a variety of conditions. The process that is gone through to assure this reliability and speed of real time systems makes these systems expensive to develop and very prone to fatal errors if small changes are made within the software. In addition, real time systems of this type are developed over many years, beginning with a common base which advances with further development. It is not uncommon that the developers of the real time system are no longer employed or working on the systems. Consequently, the people that would be making the modifications are not aware of all of the considerations that were used to cause certain sections of the program to be written in a certain way.

In addition, a program written ten or fifteen years ago may now be utilized on modern hardware. The new hardware often will be packaged in a different manner than the hardware for which the software system was originally developed. The older hardware may well have had particular requirements that caused the software to be written in a certain way. However, new hardware and more importantly new packaging techniques have obsoleted the original hardware. The result is that the new hardware must still conform to what the software believes the hardware should appear to be. This is particularly true in the field of business telecommunication systems where the original systems of ten or fifteen years ago were placed in large cabinets that were well structured with respect to the card carriers, with each carrier having an unique physical address. As technology has developed, the original carriers have been downsized and are no longer mounted in cabinets; rather, the modules may be individually mounted on walls or placed in racks in random order. However, the software systems that are utilized to control this new hardware configuration still anticipates that it is like the original hardware design.

To overcome this problem, designers have used the physical address information to identify one module from another. Also, it is necessary to visually identify these different modules so that service personnel know which module is which. Unfortunately, prior art techniques identify the physical hardware address of a carrier or module through the use of dip switches or wire straps that are normally positioned on the back of the module or carrier; whereas, the visual identification of that module is placed on the front of the module. Interestingly enough, this separation of the physical address from the visual address causes a large number of problems in the field. In addition, the modules are interchangeable and are only uniquely specified by the cards that are placed in them, but the cards assume addresses based on the physical address of the module. The card will transmit these assumed addresses to the central controller. In turn, the central controller bases control messages sent to the cards on the assumed addresses.

SUMMARY OF THE INVENTION

This invention is directed to solving these and other problems and disadvantages of the prior art. According to an embodiment of the invention, the visual address and the physical address are combined in one unit.

BRIEF DESCRIPTION OF THE DRAWINGS

FIGS. 4–6 illustrate tables for defining addresses for printed circuit cards and carriers;

DETAILED DESCRIPTION

Figure 1:
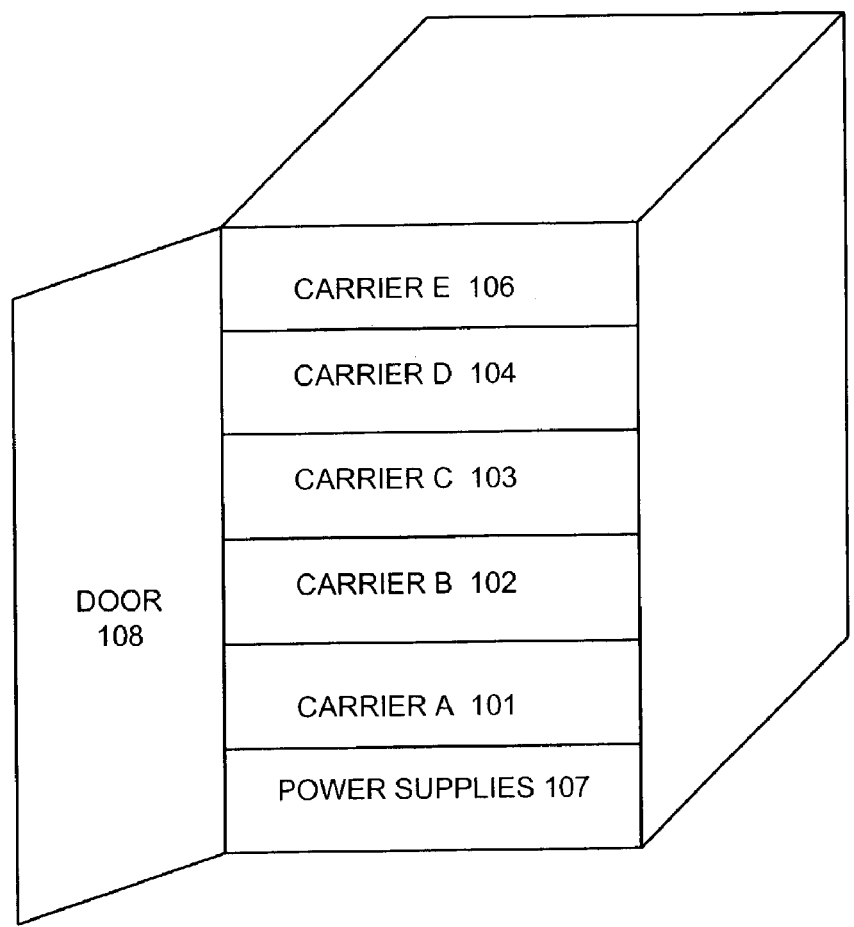
FIG. 1 illustrates a cabinet having a plurality of printed circuit card carriers.
Figure 2:
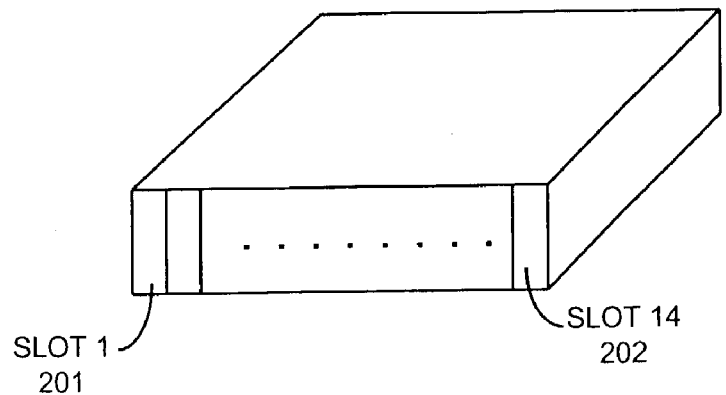
FIG. 2 illustrates a printed circuit card carrier.

FIG. 1 illustrates an example of an original hardware design for which software was developed. In FIG. 1, it can be seen that there are carrier A(101)-carrier E(106). Each of these carriers have 14 printed circuit card slots as illustrated in FIG. 2. In FIG. 1, carrier A always occupies the lower portion of the cabinet with carrier B(102) being placed immediately above it and so forth. Each printed circuit card that is plugged into a particular slot in a carrier must respond to a specific hardware address transmitted on the bus from a controller. This address, for historical reasons in the present example, varies considerably. FIG. 4 gives an example of the hex address to which a card must respond depending upon the slot and carrier into which it is plugged. In the original hardware design illustrated in FIG. 1, the unique address designation for a printed circuit card depended on which slot of which carrier it was plugged into. It was not a major factor since the carriers' addresses were pre-wired via the cabinet address bus harness/cable. In addition, the carriers illustrated in FIG. 1 were not interchangeable. For example, a carrier originally wired as a carrier A(101) could not be utilized as any other carrier.

Figure 3:
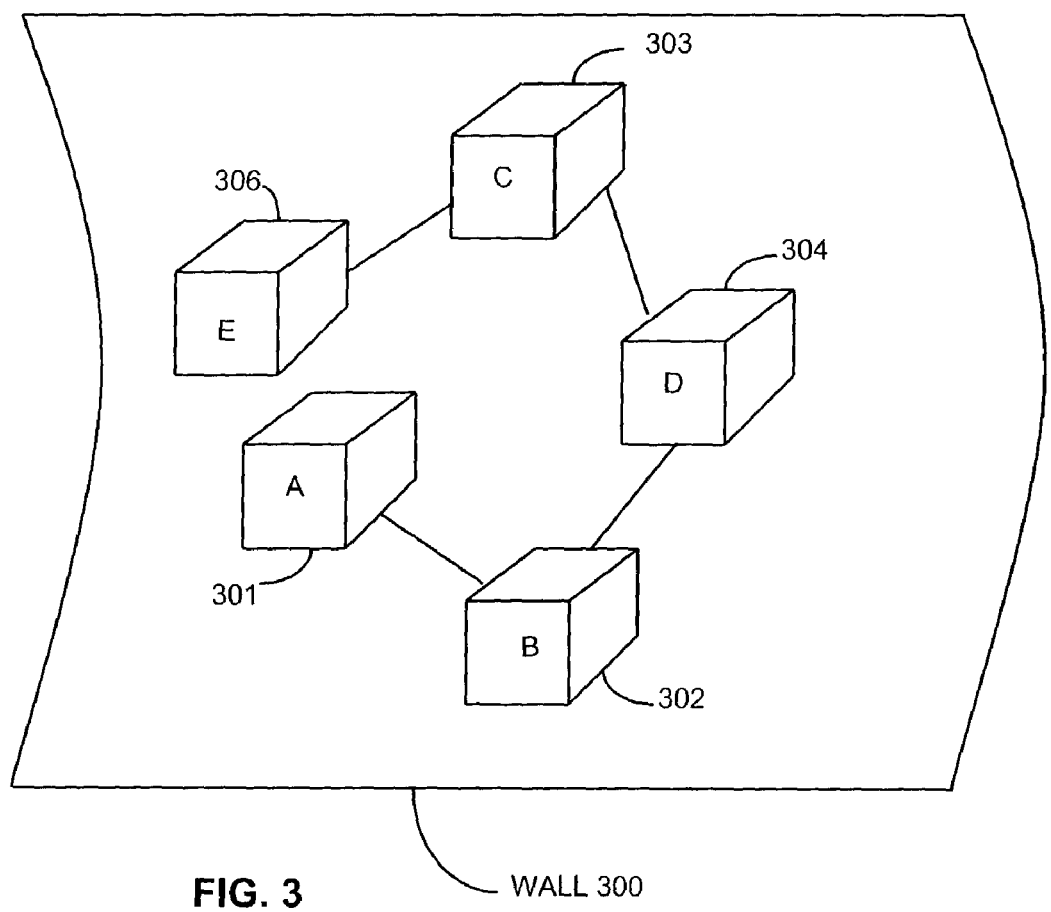
FIG. 3 illustrates an arrangement of module each having a plurality of printed circuit cards mounted on a wall.

FIG. 3 shows one of many embodiments which, due to the advent of new and more compact technology, has allowed the hardware to be packaged in a different manner. As illustrated in FIG. 3, the carriers/modules now have been packaged so that they are a great deal more compact and are simply screwed onto wall 300, rather than being assembled by being placed in a common cabinet. In addition, there is no order required as to how these modules/carriers are placed into wall 300. This is purposely done in order to allow the greatest flexibility in the field. The carriers 301–306 illustrated in FIG. 3 are then interconnected by cables. Furthermore, the carriers are interchangeable in the sense that cards for carrier E can be removed and the cards that would be used in carrier A can be plugged into carrier E. They can function there as long as the address that each card responds to has been changed from carrier E to that of carrier A.

Figure 7:
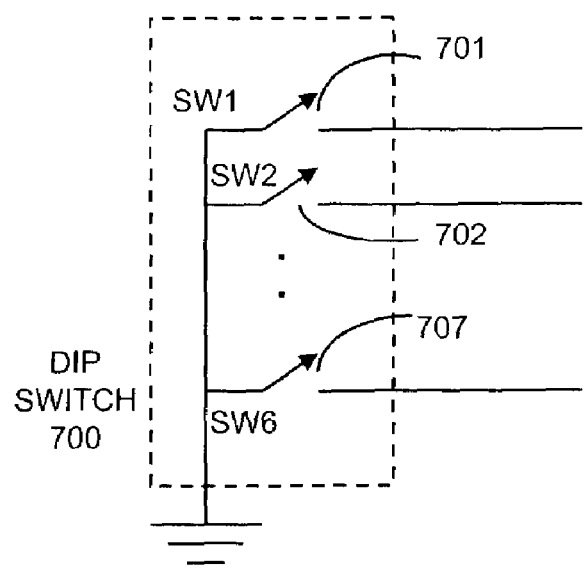
FIG. 7 illustrates, in schematic form, a DIP switch.
Figure 8:
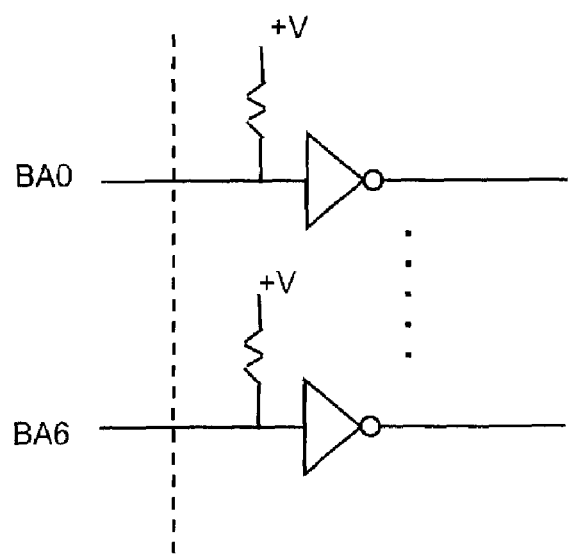
FIG. 8 illustrates, in schematic form, a portion of a printed circuit card.

A solution for solving this problem is illustrated in FIG. 7 by switch array 700. There are six individual switches (switch 701–707) that are selectively connected to by cards depending upon what slot the card is inserted into. The selection is actually done by the back plane at the slot rather than the individual card. The card reads this identification address and responds to that address when the address over the common address bus is transmitted from the controller. FIG. 8 illustrates the configuration of seven circuits that are on each printed circuit card that will be plugged into a card slot. As can be seen, the identification addresses consist of seven bits (BA 0 through BA 6). FIG. 6 illustrates how the six switches of FIG. 7 will be actuated for each carrier. FIG. 5 then illustrates how the BA address leads will be interconnected to these switches by the back plane of the carrier to yield the proper hex address illustrated in FIG. 4. Note, that FIG. 5 designates that some leads will not be connected to a switch. Rather the leads will be allowed to float open causing a zero to be outputted on the corresponding inverter circuit or the lead will be grounded causing a one to be outputted on the corresponding inverter.

The problem that arose in prior art solutions was that the switch array 700 of FIG. 7 was implemented by DIP switches or hardwired connections and was not directly associated with the cable labeling, such as carrier A. This, of course, caused no problem in the cabinet of FIG. 1 since the carriers were always physically located in the same place. However, in the hardware illustrated in FIG. 3 numerous problems have occurred in the field because the DIP switches setting did not correspond to the letter designation. In addition, DIP switches, because of their size, are notorious for not being properly set in one position or another. Further, the DIP switches were often placed in places were the modules had to be partially disassembled before the access could be gained to the DIP switch. This lack of immediate access to the DIP switches caused many problems within the field.

Figure 9:
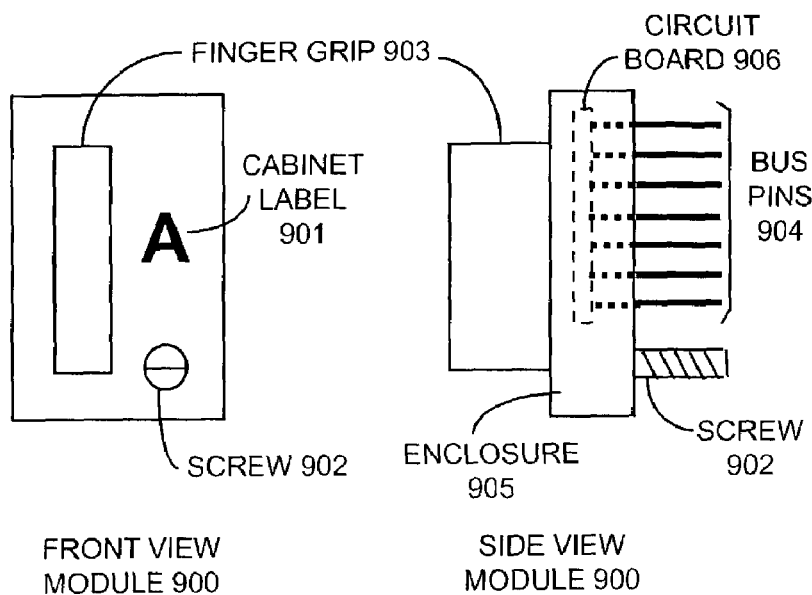
FIG. 9 illustrates an embodiment of the invention.

FIG. 9 illustrates an embodiment of the invention designed to overcome the problems of the prior art by combining the switch array 700 of FIG. 7 with the visual label. As can be clearly seen, unit 900 consists of enclosure 905; cabinet label 901 which is affixed or molded as part of enclosure 905; screw 902; and circuit board 906 with attached bus pins 904 that define the address as given by the table of FIG. 5 for visual cabinet label 901. The important thing is that module 900 can be tested within the factory and certified that the correct contacts are being made to the identification address bus. Screw 902 is utilized to physically fasten the module 900 onto the carrier to avoid accidental removal from an active system. The carrier provides physical connection from the module 900 to the identification address bus on the back plane.

Figure 10:
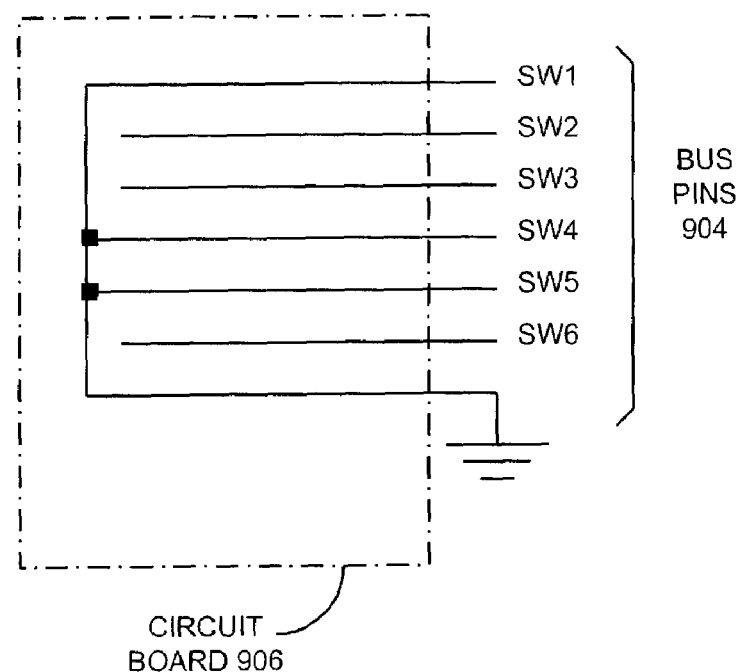
FIG. 10 illustrates, in schematic form, an embodiment of a printed circuited board.

FIG. 10 illustrates the circuit schematic of circuit board 906 for cabinet A. The connections may be made using printed circuit board technology or wire straps and are made in accordance with FIG. 5. After the connections are made, circuit board 906 is encapsulated in enclosure 905 using techniques well known to those skilled in the art. Then, each unit is tested in a factory using automated test equipment to verify that the connections agree with visual cabinet label 901.

Of course, various changes and modification to the illustrated embodiments described above will be apparent to those skilled in the art. Such changes and modifications can be made without departing from the spirit and scope of the invention and without diminishing its intended advantages. It is therefore intended that such changes and modifications be covered by the following claims except insofar as limited by the prior art.

What is claimed is:

1. Devices for visual and electronic identification of electronic carriers having only one individual device for each electronic carrier and each electronic carrier has a plurality of card slots for receiving a plurality of printed circuit cards, each device comprising:
    an enclosure;
    a carrier label for providing visual identification for an individual one of the electronic carriers and affixed to the enclosure; and
    a circuit board encapsulated in the enclosure and the circuit board having electronic identification of the individual one of the electronic carriers and the electronic identification of the individual one of the electronic carriers is communicated via bus pins attached to the circuit board to the individual one of the electronic carriers upon the bus pins being inserted into the individual one of electronic carriers and the circuit board defining electronic identifications of each of the card slots of the individual one of the electronic carriers whereby the electronic identification of the card slots defines the type of printed circuit card that can be inserted into a particular card slot.

2. Each of the devices of claim 1 further comprises a finger grip attached to the enclosure for assisting in insertion and removal of the device from the individual one of the electronic carriers.

3. Each of the devices of claim 2 further comprises a screw for physically attaching the enclosure to the individual one of the electronic carriers upon insertion of the apparatus into the individual one of the electronic carriers thereby avoiding accidental removal from an active system.

4. Each of the devices of claim 1 wherein the electronic identification is determined by selectively connecting a subset of the bus pins to one of the bus pins that is maintained at a fixed voltage by the individual one of the electronic carriers upon insertion of the apparatus into the individual one of the electronic carriers.

5. Each of the devices of claim 1 wherein the carrier label is readily visible upon insertion of the apparatus into the individual one of the electronic carriers.

6. A method for providing visual and electronic identification of electronic carriers and each electronic carrier has a plurality of card slots for receiving a plurality of printed circuit cards, comprising the steps of:
    encapsulating only a circuit board and bus pins attached to the circuit board into an enclosure;
    affixing a carrier label to the enclosure where the carrier label defines visual identification of an electronic carrier;
    producing the electronic identification on the circuit board whereby the electronic identification is communicated via bus pins attached to the circuit board to the electronic carrier when the bus pins are inserted into the electronic carrier; and defining electronic identifications by the circuit board of each of the card slots the electronic carrier whereby the electronic identification of the card slots defines the type of printed circuit card that can be inserted into a particular card slot; and inserting the bus pins attached to the circuit board into the electronic carrier.

7. The method of claim 6 further comprises a finger grip attached to each enclosure for assisting in insertion and removal of the bus pins from each electronic carrier.

8. The method of claim 7 further comprises a screw for physically attaching each enclosure to each electronic carrier upon insertion of the bus pins into each electronic carrier thereby avoiding accidental removal from an active system.

9. The method of claim 6 wherein the step of producing the electronic identification comprises the step of selectively connecting a subset of the bus pins to one of the bus pins that is maintained at a fixed voltage by each electronic carrier upon insertion of the bus pins into each electronic carrier.

10. The method of claim 6 further comprises the step of arranging the carrier label to be readily visible upon insertion of the bus pins into each electronic carrier.

\* \* \* \* \*